(12) United States Patent
Epstein et al.

(10) Patent No.: US 11,269,036 B2
(45) Date of Patent: Mar. 8, 2022

(54) SYSTEM AND METHOD FOR PHASE UNWRAPPING FOR AUTOMATIC CINE DENSE STRAIN ANALYSIS USING PHASE PREDICTIONS AND REGION GROWING

(71) Applicant: University of Virginia Patent Foundation, Charlottesville, VA (US)

(72) Inventors: Frederick H. Epstein, Charlottesville, VA (US); Daniel A. Auger, Charlottesville, VA (US); Changyu Sun, Charlottesville, VA (US); Xiaoying Cai, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 344 days.

(21) Appl. No.: 16/369,700

(22) Filed: Mar. 29, 2019

(65) Prior Publication Data

US 2019/0302210 A1 Oct. 3, 2019

Related U.S. Application Data

(60) Provisional application No. 62/649,795, filed on Mar. 29, 2018.

(51) Int. Cl.
*G01R 33/56* (2006.01)
*G01R 33/563* (2006.01)

(52) U.S. Cl.
CPC ... *G01R 33/56325* (2013.01); *G01R 33/5608* (2013.01)

(58) Field of Classification Search
CPC ............ G01R 33/56; G01R 33/5608; G01R 33/56316; G01R 33/56325; G01R 33/56545; G01R 324/309

USPC .......................................................... 324/309
See application file for complete search history.

(56) References Cited

U.S. PATENT DOCUMENTS 6,147,492 A * 11/2000 Zhang ................ G01R 33/4828
324/307
7,813,537 B2 10/2010 Epstein et al.
(Continued)

OTHER PUBLICATIONS

Spottiswoode et al. "Tracking Myocardial Motion From Cine DENSE Images Using Spatiotemporal Phase Unwrapping and Temporal Fitting", IEEE Trans. On Medical Imaging, vol. 26, No. 1, Jan. 2007, pp. 15-30 (Year: 2007).*
(Continued)

*Primary Examiner* — Rishi R Patel
*Assistant Examiner* — Courtney G McDonnough
(74) *Attorney, Agent, or Firm* — Meunier Carlin & Curfman LLC

(57) ABSTRACT

In one aspect the disclosed technology relates to embodiments of a method (e.g., for automatic cine DENSE strain analysis) which includes acquiring magnetic resonance data associated with a physiological activity in an area of interest of a subject where the acquired magnetic resonance data includes one or more phase-encoded data sets. The method also includes determining, from at least the one or more phase-encoded data sets, a data set corresponding to the physiological activity in the area of interest where the reconstruction comprises performing phase unwrapping of the phase-encoded data set using region growing along multiple pathways based on phase predictions.

19 Claims, 12 Drawing Sheets
(5 of 12 Drawing Sheet(s) Filed in Color)

(56) References Cited

U.S. PATENT DOCUMENTS

| | | | |
|---|---|---|---|
| 8,700,127 | B2 | 4/2014 | Salerno et al. |
| 9,183,626 | B2 | 11/2015 | Zhao et al. |
| 9,224,210 | B2 | 12/2015 | Epstein et al. |
| 9,589,345 | B2 | 3/2017 | Zhao et al. |
| 2010/0141253 | A1* | 6/2010 | Takizawa ............ G01R 33/4824 324/309 |
| 2015/0285889 | A1 | 10/2015 | Chen et al. |
| 2016/0148378 | A1 | 5/2016 | Salerno et al. |
| 2017/0307712 | A1 | 10/2017 | Cai et al. |
| 2018/0153431 | A1* | 6/2018 | Amies ................ G01R 33/4818 |

OTHER PUBLICATIONS

Gilliam, Andrew D., and Frederick H. Epstein. "Automated motion estimation for 2-D cine DENSE MRI." IEEE transactions on medical imaging 31.9 (2012): 1669-1681.

Simpson, Robin M., Jennifer Keegan, and David N. Firmin. "MR assessment of regional myocardial mechanics." Journal of Magnetic Resonance Imaging 37.3 (2013): 576-599.

Spottiswoode, Bruce S., et al. "Tracking myocardial motion from cine DENSE images using spatiotemporal phase unwrapping and temporal fitting." IEEE transactions on medical imaging 26.1 (2006): 15-30.

Spottiswoode, Bruce S., et al. "Motion-guided segmentation for cine DENSE MRI." Medical image analysis 13.1 (2009): 105-115.

Xu, Wei, and Ian Cumming. "A region-growing algorithm for InSAR phase unwrapping." IEEE Transactions on Geoscience and Remote Sensing 37.1 (1999): 124-134.

Young, Alistair A., et al. "Generalized spatiotemporal myocardial strain analysis for DENSE and SPAMM imaging." Magnetic resonance in medicine 67.6 (2012): 1590-1599.

\* cited by examiner

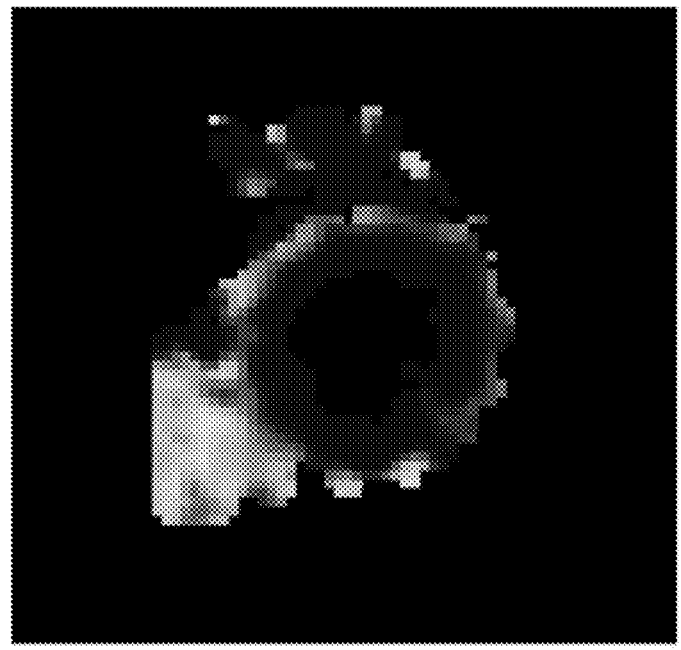
FIG. 13A
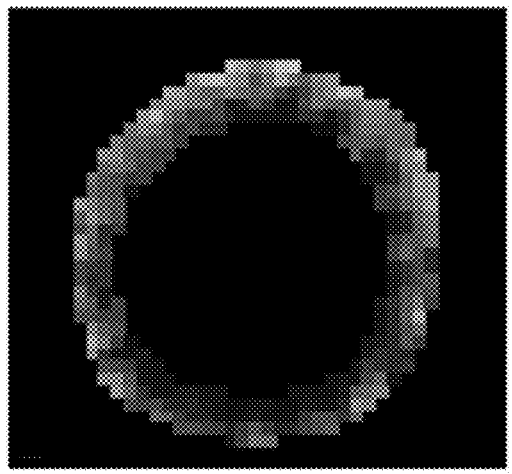 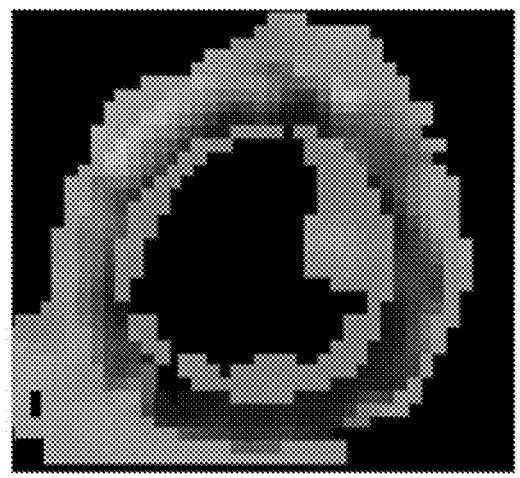
FIG. 13B  FIG. 13C

SYSTEM AND METHOD FOR PHASE UNWRAPPING FOR AUTOMATIC CINE DENSE STRAIN ANALYSIS USING PHASE PREDICTIONS AND REGION GROWING

CROSS-REFERENCE TO RELATED APPLICATION

This Application claims priority to and benefit under 35 U.S.C § 119(e) of U.S. Provisional Patent Application Ser. No. 62/649,795, entitled "System and Method for Phase Unwrapping for Automatic Cine DENSE Strain Analysis Using Phase Predictions and Region Growing," filed Mar. 29, 2018, which is hereby incorporated by reference herein in its entirety as if fully set forth below.

FIELD

This disclosure relates to magnetic resonance imaging operations that utilize phase unwrapping methodologies that fully automate DENSE analysis method, among other magnetic resonance phase encoded data sets.

BACKGROUND

The present disclosure generally relates to the field of medical imaging for analysis of certain physiological activities of a subject. Cardiac imaging to analyze myocardial strain, for example, is of growing importance for the clinical assessment of heart disease. Various conventional imaging techniques can provide for an assessment of the heart with regard to spatial coverage and an evaluation of the strain tensor. For example, three-dimensional (3D) measurements can provide a complete assessment of the heart with regard to spatial coverage and a comprehensive evaluation of the strain tensor.

Phase-contrast displacement encoding have been used for myocardial imaging, and cine DENSE (displacement encoding with stimulated echoes) has emerged as a strain imaging technique that, compared to tagging, can offer high spatial resolution, equivalent accuracy and better reproducibility, and where strain analysis is less time consuming ([1], [2], [3]). DENSE can provide quantification of myocardial strain based on displacement of myocardial tissue, where tissue displacement is encoded as a phase of a stimulated-echo signal.

Because phase wrapping may occur during systolic phases, spatiotemporal phase unwrapping algorithms generally involving computing motion trajectories and strain. Current DENSE analysis including that derived from cine DENSE methods are aided by user-defined myocardial contours.

Cine images are short movies that are able to show heart motion throughout the cardiac cycle, in short-axis. Measurement of left ventricular (LV) mass, ejection fraction, percentage of LV mass subtended by scar, and extracellular volume may be used, e.g., for identification of HCM patients at highest risk.

SUMMARY

In one aspect the disclosed technology relates to embodiments of a method (e.g., for automatic cine DENSE strain analysis) which includes acquiring magnetic resonance data associated with a physiological activity in an area of interest of a subject where the acquired magnetic resonance data includes one or more phase-encoded data sets. The method also includes determining, from at least the one or more phase-encoded data sets, a data set (e.g., displacement-encoded information) corresponding to the physiological activity in the area of interest where the reconstruction includes performing phase unwrapping of the phase-encoded data set using region growing along multiple pathways based on phase predictions.

In some embodiments, the instant method includes identifying, by the processor, an initial region where phase wrapping has not occurred (e.g., via principle component analysis); iteratively determining, by the processor, a perimeter of phase-wrapped pixels; and adding, by the processor, one or more pixels of candidate growth pixels evaluated via spatiotemporal linear prediction analysis determined from, at least, the one or more pixels where a portion of the one or more pixels is added based on a reliability threshold established from the spatiotemporal linear prediction analysis. The phase-encoded data set may include data from a displacement encoding with stimulated echo (DENSE) measurements.

In some embodiments, the instant method can be performed to facilitate a fully automatic DENSE analysis method that can simultaneously unwrap and segment the myocardium. It is observed that the embodiments of the instant method can automatically select fewer extramyocardial pixels as compared to existing methodologies—thus reducing computation time and provides for a greater phase unwrapping success rate as compared to such methodologies.

In another embodiment, the disclosed technology encompasses a system having at least one processor and at least one memory device coupled to the processor for storing computer-readable instructions which, when executed by the at least one processor, cause the system to perform functions of a method. The system implements a method of acquiring magnetic resonance data associated with a physiological activity in an area of interest of a subject where the acquired magnetic resonance data includes one or more phase encoding data sets, and determining, from at least the one or more phase encoding data sets, a data set (e.g., displacement-encoded information) corresponding to the physiological activity in the area of interest where the reconstruction includes performing phase unwrapping of the phase encoding data set using region growing along multiple pathways based on phase predictions.

In another embodiment of this disclosure, a non-transitory computer-readable medium has stored instructions that, when executed by one or more processors, cause a computing device to perform functions of a method of acquiring magnetic resonance data associated with a physiological activity in an area of interest of a subject where the acquired magnetic resonance data includes one or more phase-encoded data sets, and determining, from at least the one or more phase-encoded data sets, a data set (e.g., displacement-encoded information) corresponding to the physiological activity in the area of interest where the reconstruction includes performing phase unwrapping of the phase-encoded data set using region growing along multiple pathways based on phase predictions.

Other aspects and features according to the example embodiments of the disclosed technology will become apparent to those of ordinary skill in the art, upon reviewing the following detailed description in conjunction with the accompanying figures.

BRIEF DESCRIPTION OF THE DRAWINGS

The patent or application file contains at least one drawing executed in color. Copies of this patent or patent application publication with the color drawing(s) will be provided by the Office upon request and payment of the necessary fee. Reference will now be made to the accompanying drawings, which are not necessarily drawn to scale.

FIGS. 13A, 13B, and 13C show end-systolic principle shortening strain (PSS) map automatically computed using an embodiment of the instant method and using manually-drawn LV contours.

DETAILED DESCRIPTION

Figure 1:
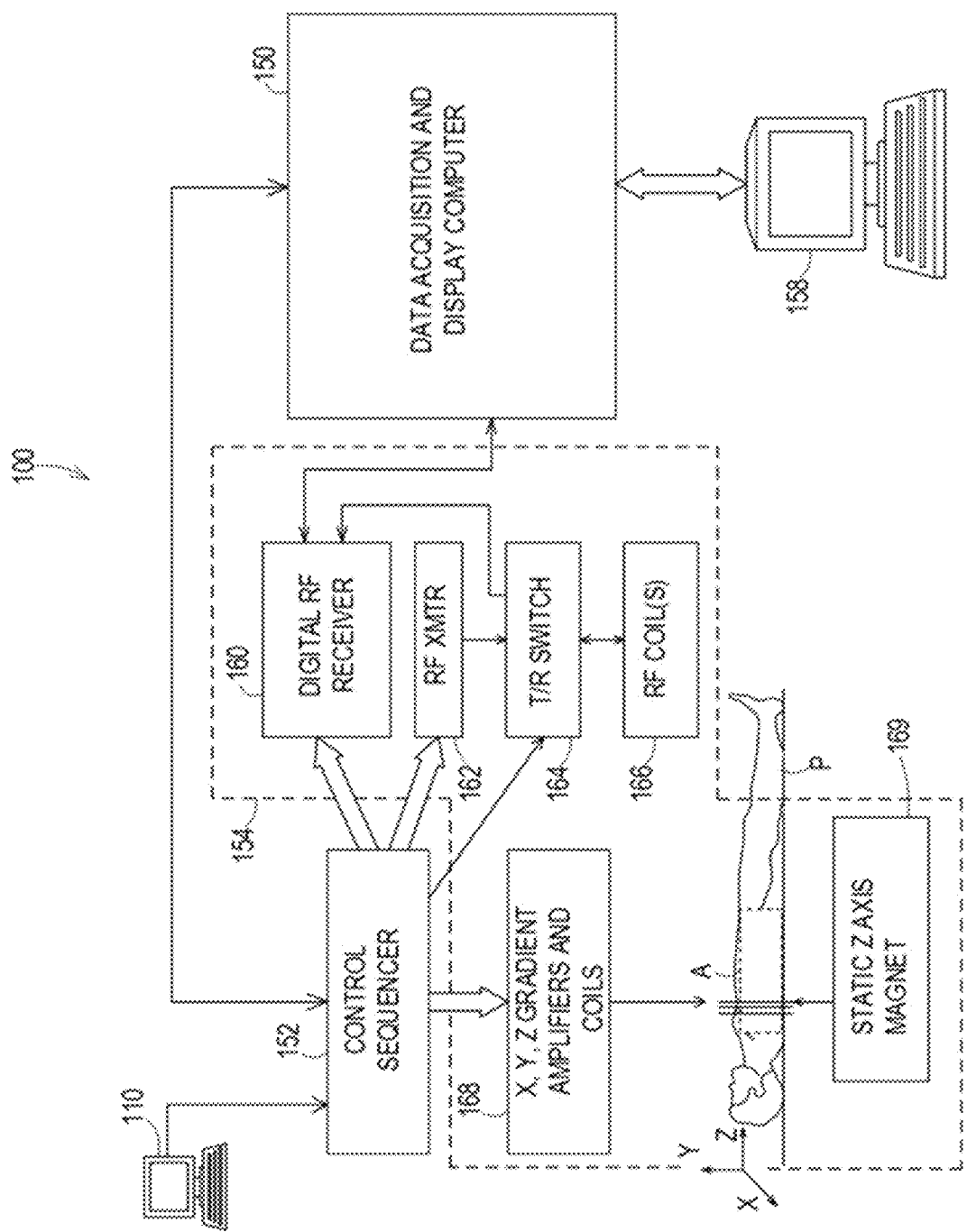
FIG. 1 is a system diagram illustrating an operating environment capable of implementing aspects of the disclosed technology.

In some aspects, the disclosed technology relates to free-breathing parameter mapping with high-contrast image registration. Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. For example, [6] refers to the 6th reference in the list, namely Xu, W. et al., IEEE Transactions on Geoscience and Remote Sensing 1999, 37:124-34. All references cited and discussed in this specification are incorporated herein by reference in their entireties and to the same extent as if each reference was individually incorporated by reference.

In the following description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure of automated DENSE analysis in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
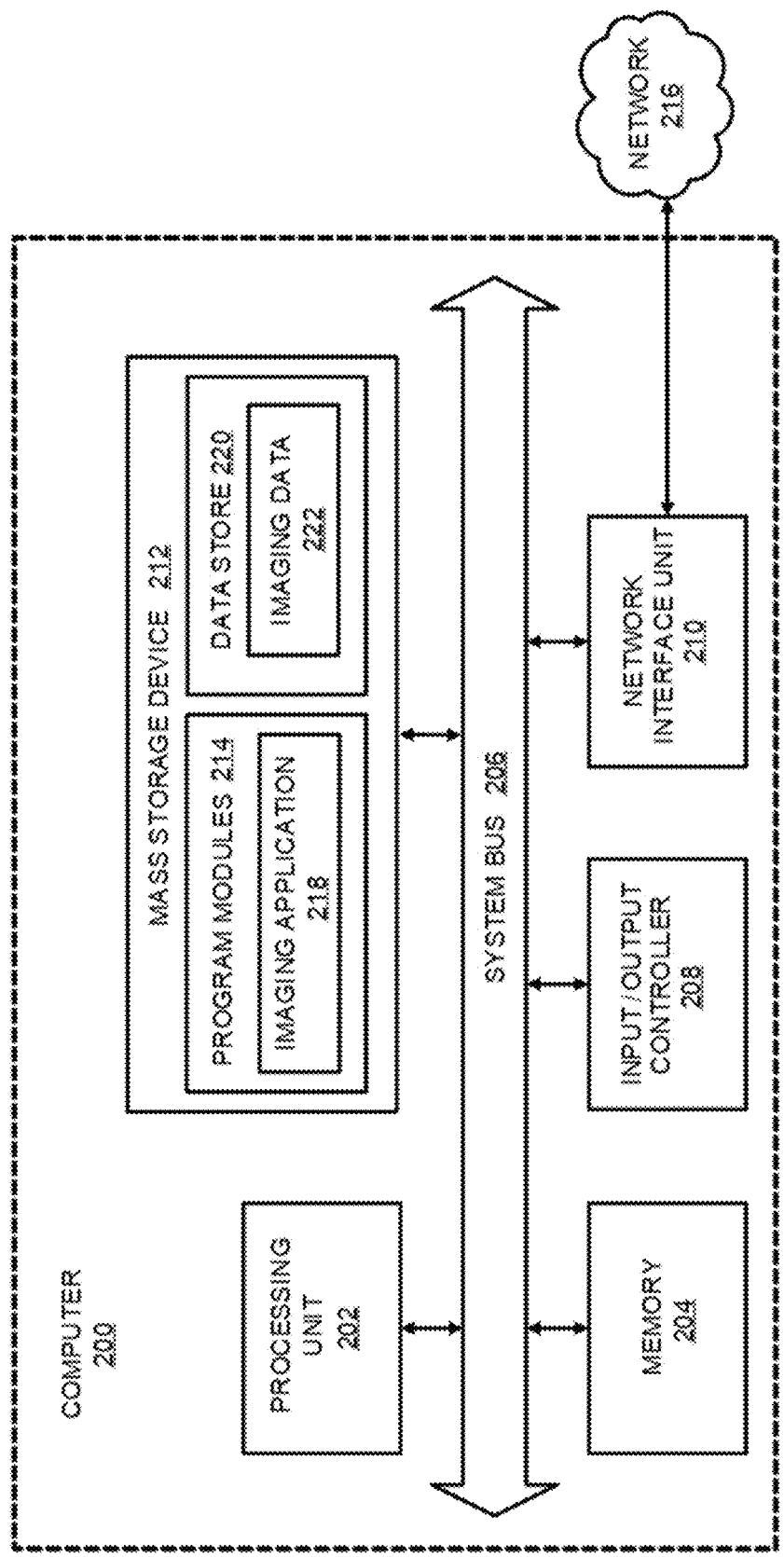
FIG. 2 is a computer architecture diagram showing a general computing system capable of implementing aspects of the disclosed technology.

FIG. 2 is a computer architecture diagram showing a general computing system capable of implementing aspects of the present disclosure in accordance with one or more embodiments described herein. A computer 200 may be configured to perform one or more functions associated with embodiments of automated DENSE analysis method with region growing illustrated in one or more of FIGS. 3-15. For example, the computer 200 may be configured to perform operations of the method shown in FIG. 3 and as described below. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of FIGS. 3-15 discussed below, for example to cause the computer 200 to perform operations of the automated DENSE analysis with region growing shown in FIG. 3 and as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated in FIGS. 3-14. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 3:
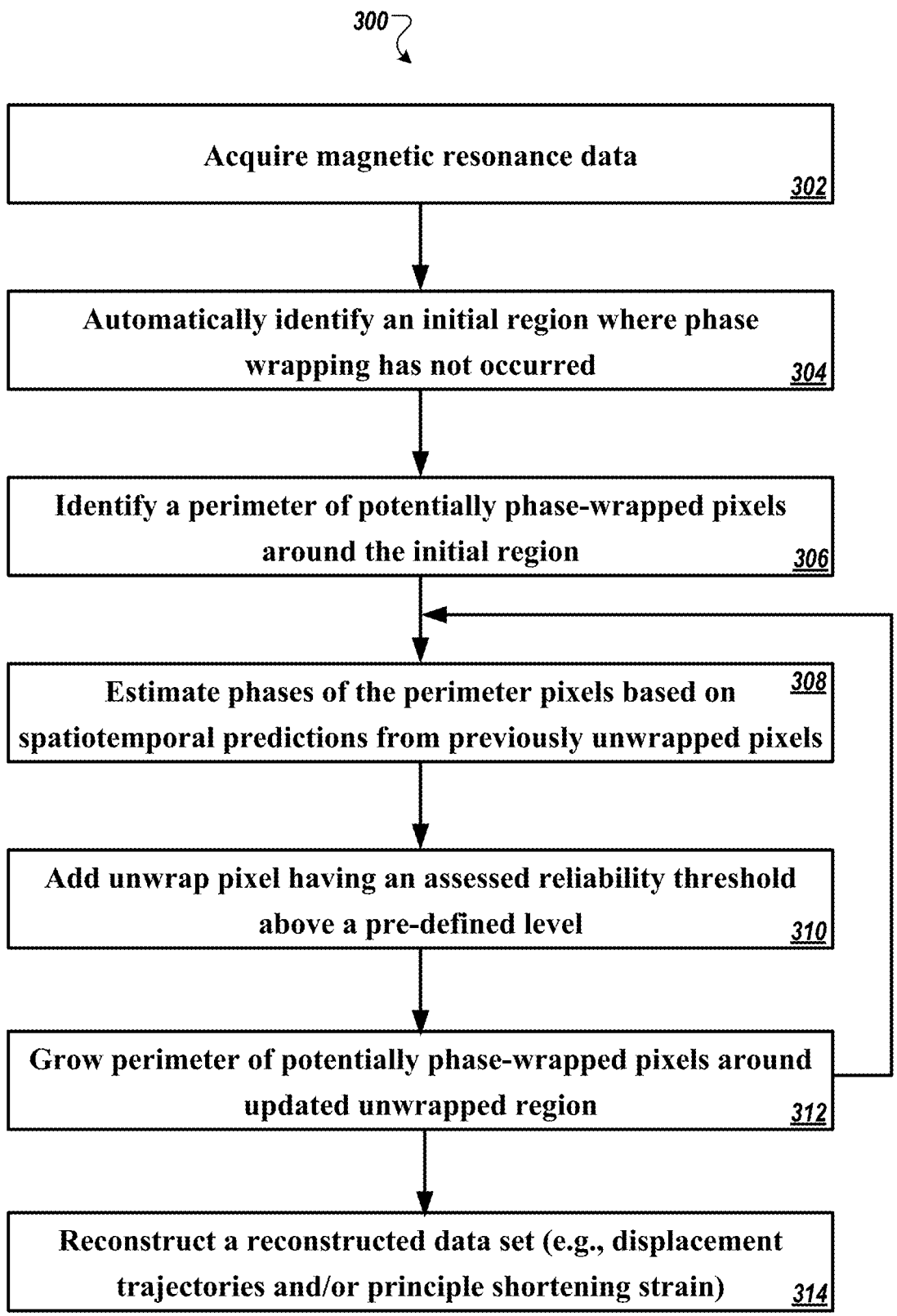
FIG. 3 is a flow diagram illustrating operations of an embodiment of a method of automated DENSE analysis with region growing in accordance with one embodiment of the present disclosure.

FIG. 3 is a flow diagram illustrating operations of a method 300 of automated DENSE analysis with region growing in accordance with one embodiment of the present disclosure. As shown, the method 300 includes operation 302, where magnetic resonance data associated with a physiological activity in an area of interest of a subject is acquired. The acquiring of the magnetic resonance data at operation 302 includes acquiring one or more phase-encoded data sets, for example, comprising cine DENSE measurements.

In some embodiments, cine images are obtained with electrocardiogram (ECG) triggered segmented imaging. Segmented acquisition is the process of dividing the cardiac cycle into multiple segments to produce a series of images that can be displayed as a movie. The cardiac cycle begins with an R wave of the electrocardiogram, ends with the subsequent R wave and is typically divided into 10 to 20 segments, depending on the heart rate. Without limiting this disclosure to any single example, each image in the cine is typically composed of information gathered over several heart beats allowing for a movie to be acquired with a breath hold of 10 to 20 seconds, depending on the sequence. As in any movie, the final cine is a sequence of individual frames. These images can be very helpful in studying cardiac function, valvular function, and movement of blood through the heart. In the cardiac cycle, which is comprised of multiple phases represented by different frames in the cine, the method may determine two phases, namely end-diastole and end-systole. At end-diastole, the myocardium is completely relaxed and is fully filled with blood that will be pumped in the following systole phase. At end-systole, the myocardium is completely contracted and has pumped all the blood it can, out of the ventricle.

Referring still to FIG. 3, the method 300 then includes an analysis of cine DENSE measurement to automatically determine, for example, displacement-encoded information such as displacement trajectories and/or principle shortening strain (PSS). The method 300 preferably utilizes multiple phase prediction pathways and consistency checking for region growing.

Figure 4:
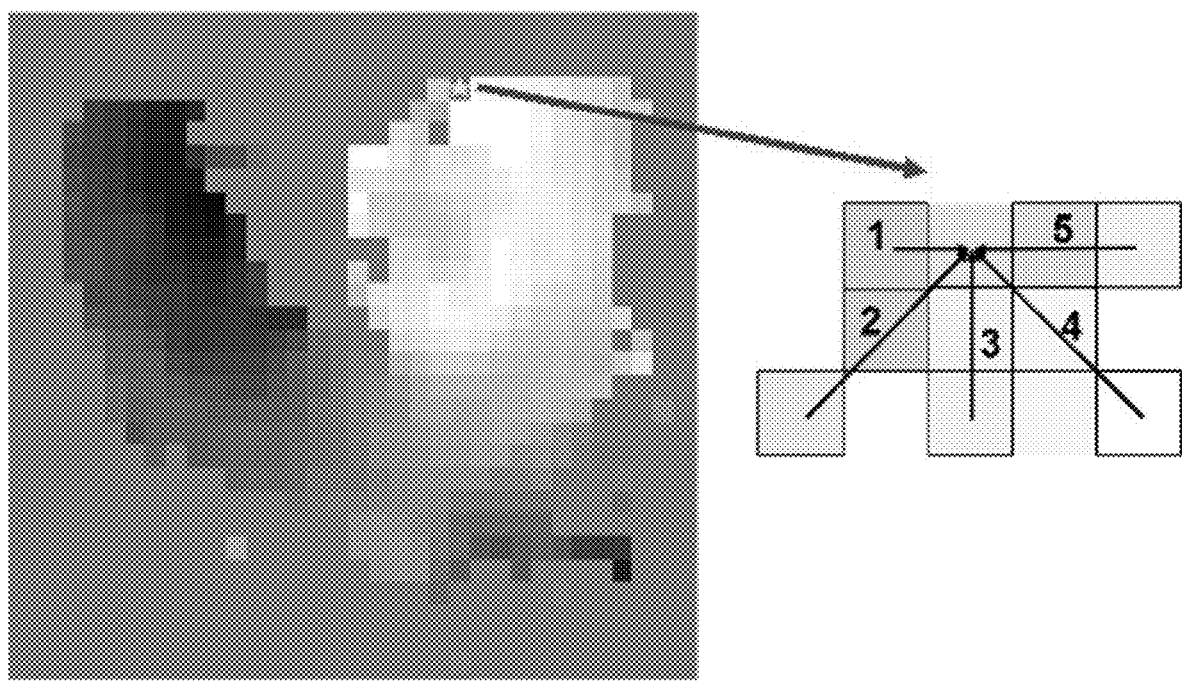
FIG. 4 shows an example of an initial region for region growing selected by an embodiment of the instant method.

Referring still to FIG. 3, the phase unwrapping operation includes identifying (step 304) an initial region in the myocardium where phase wrapping has not occurred. This initial region serves as a seed for growing a continuous region of unwrapped pixels. In some embodiments, the initial region is identified using a principle component analysis. The principle component analysis may be fully automated to operate without human intervention. FIG. 4 shows an example of an initial region (denoted with a star) selected at an early cardiac phase where phase wrapping has not occurred.

Referring still to FIG. 3, the method 300 then includes unwrapping from the initial region by identifying (step 306) a perimeter of potentially phase-wrapped pixels around the initial region. In FIG. 4, the perimeter is shown comprising pixels denoted as "1", "2", "3", "4", and "5".

The method then includes estimating (step 308) phases of the perimeter pixels based on spatiotemporal predictions from previously unwrapped pixels. That is, multiple spatiotemporal linear predictions are used to predict the phases of the perimeter pixels. Each spatiotemporal linear prediction analysis includes a previously unwrapped pixel (in FIG. 4, the seed region 402) and one or more neighbor pixels in, or beyond, the perimeter. In FIG. 4, each potentially phase-wrapped pixel (shown as "1", "2", "3", "4", and "5") is assessed along a prediction pathway (shown with arrows) with a spatiotemporal linear prediction. Indeed, multiple prediction pathways can be concurrently assessed.

Referring still to FIG. 3, the method 300 then includes adding (310) pixels in the perimeter as an unwrapped pixel based on an assessed reliability threshold. In some embodiments, the reliability thresholds is established based on the overall predicted phase ($T_{Prediction}$). In some embodiments, the reliability thresholds is also established based on variations of the multiple predictions ($T_{Deviation}$). Multiple spatiotemporal prediction pathways, in some embodiments, are used for each perimeter pixel undergoing evaluation. The assessment of variation are made among the predictions from the different pathway.

Indeed, if the attempt to add a candidate pixel is deemed reliable, the candidate pixel is then included in the unwrapped region. To this end, pixels having unreliable predictions are excluded. Reliability, as used herein, refers to the conditions under which a section of the DENSE image will be unwrapped correctly and may be a function of noise and topographic structure of the data.

Referring still to FIG. 3, the method 300 then includes growing (step 312) the perimeter among a next set potentially phase-wrapped pixels around the updated unwrapped region. The process is then repeated (e.g., steps 308, 310, 312) to assess the next set potentially phase-wrapped pixels and continues until no further additional pixels are added to the unwrapped region for a given evaluation. The process may then continue to a next DENSE image in the cine image set.

Referring still to FIG. 3, once region growing through multiple phase prediction pathways and consistency checking has unwrapped the pixels of a DENSE image, the resulting image can be segmented and used for displacement trajectory and strain calculations. Description of example displacement trajectory and strain calculations can be found, for example, in [4] Spottiswoode, B. S. et al, "Tracking myocardial motion from cine DENSE images using spatiotemporal phase unwrapping and temporal fitting," IEEE Trans. Med. Imaging 2007; 26:15-20, which is incorporated by reference herein in its entirety.

EXAMPLE IMPLEMENTATIONS AND RESULTS

Various aspects of the disclosed technology may be still more fully understood from the following description of example implementations and corresponding results and the images of FIGS. 5-15. Some experimental data are presented herein for purposes of illustration and should not be construed as limiting the scope of the disclosed technology in any way or excluding any alternative or additional embodiments.

A study was conducted to compare prior automatic unwrapping algorithm [5] and an embodiment of the instant method. The analysis was applied to datasets of 5 volunteers acquired using 2D short-axis cine DENSE with localized signal generation and with displacement encoding frequencies $k_e$=0.1 cyc/mm with in-plane pixel size of 2.3×2.3 mm2 and with 24-28 cardiac phases. To generate gold standard data for a comparison, the myocardium was manually contoured, phase unwrapping was applied to that segmented region, and the unwrapping results were manually inspected to ensure the absence of unwrapping errors. Optimal thresholds were determined by using an embodiment of the instant method with a range of thresholds and finding those that minimize the root mean square (RMS) error between the gold-standard data and the masked results from the proposed algorithm. To evaluate embodiments of the instant method, additional datasets (n=3) were acquired with displacement encoding frequencies of 0.14, 0.18 and 0.22 cyc/mm, leading to increased degrees of phase wrapping. Displacement trajectories and principle shortening strain (PSS) were calculated using an embodiment of the instant method and the gold standard method (as described in [2]).

Results

Figure 5:
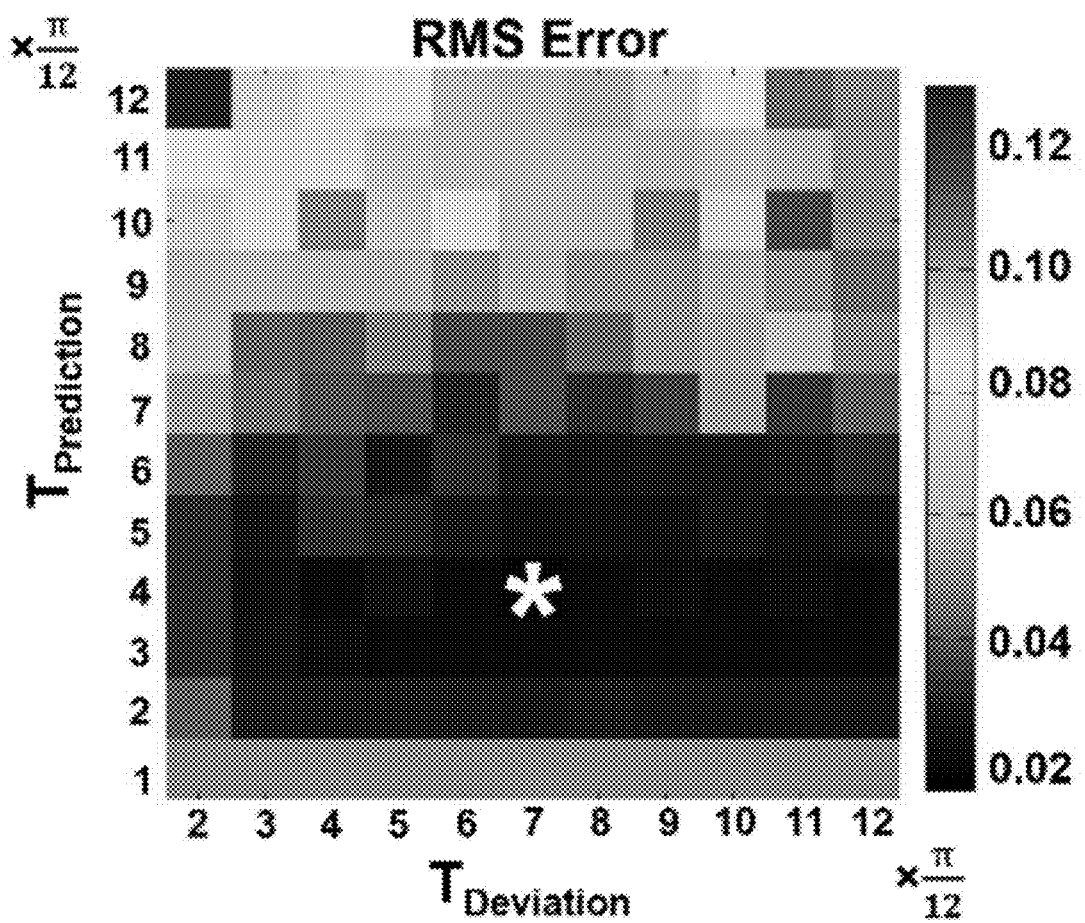
FIG. 5 shows a phase-unwrapped RMS error plot for a gold standard data set to be for comparison to an embodiment of the instant method.

FIG. 5 shows a phase-unwrapped RMS error plot of the gold standard data set for comparison to an embodiment of the instant method. In FIG. 5, the phase-unwrapped RMS error plot was based on manually-contoured phase-unwrapped images for all $k_e$ values (0.1, 0.14, 0.18, 0.22) and threshold values. The optimal thresholds correspond to a pixel indicated by * in the figure. Indeed, FIG. 5 illustrates RMS error plots for all $k_e$ values to identify the best reliability thresholds. The unsmooth RMS error function may be attributed to the non-linearity of the phase-unwrapping operation. As shown in FIG. 5, optimal values of $\pi/3$ for $T_{Prediction}$ and $7\pi/12$ for $T_{Deviation}$ were also identified.

Figure 6:
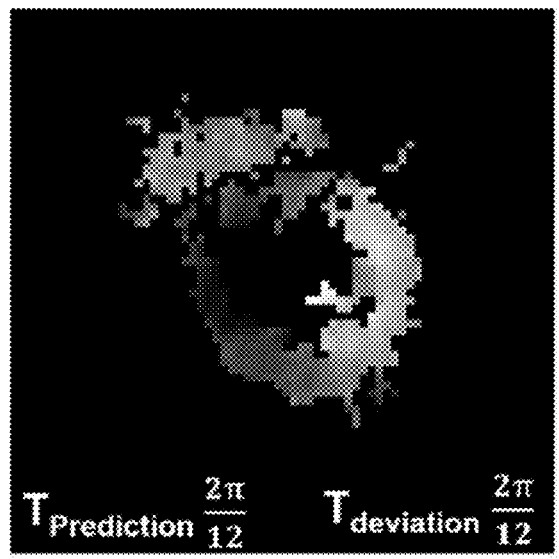
FIGS. 6, 7, and 8 show unwrapping results of embodiments of the instant method for different threshold levels.
Figure 7:
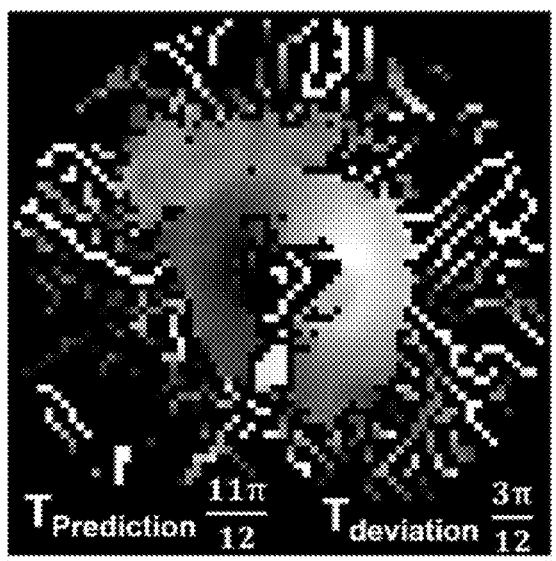
Figure 8:
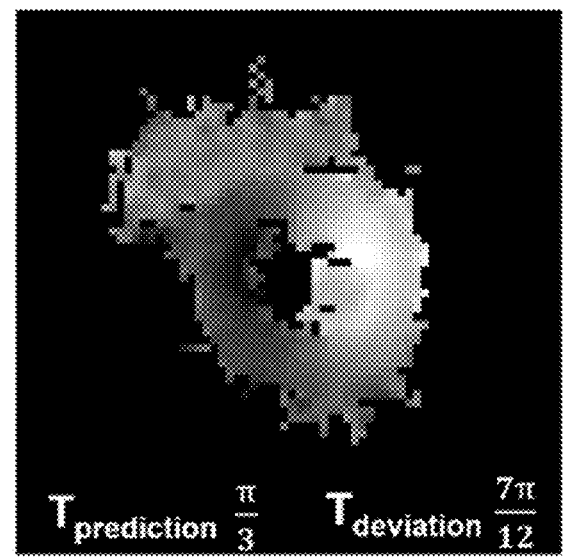

FIGS. 6, 7, and 8 show unwrapping results of an embodiment of the instant method for different selected threshold levels. In particular, FIG. 6 shows unwrapping result using low thresholds (as compared to the optimal threshold), which can and is shown to lead to the improper exclusion of myocardial pixels. FIG. 7 shows unwrapping results using high threshold values (as compared to the optimal threshold), which can and is shown to lead to the improper inclusion of surrounding tissue and blood and to subsequent phase unwrapping errors. FIG. 8 shows unwrapping results using the optimal thresholds that provide successful region definition and myocardial phase unwrapping. Indeed, FIGS. 6 and 7 illustrate poor phase unwrapping where either $T_{Prediction}$ and $T_{Deviation}$ were too low and regions of myocardium were improperly excluded during region growing, or where $T_{Prediction}$ and $T_{Deviation}$ were too high and regions of surrounding tissue and blood were improperly included in the growth region and caused unwrapping errors.

Figure 9:
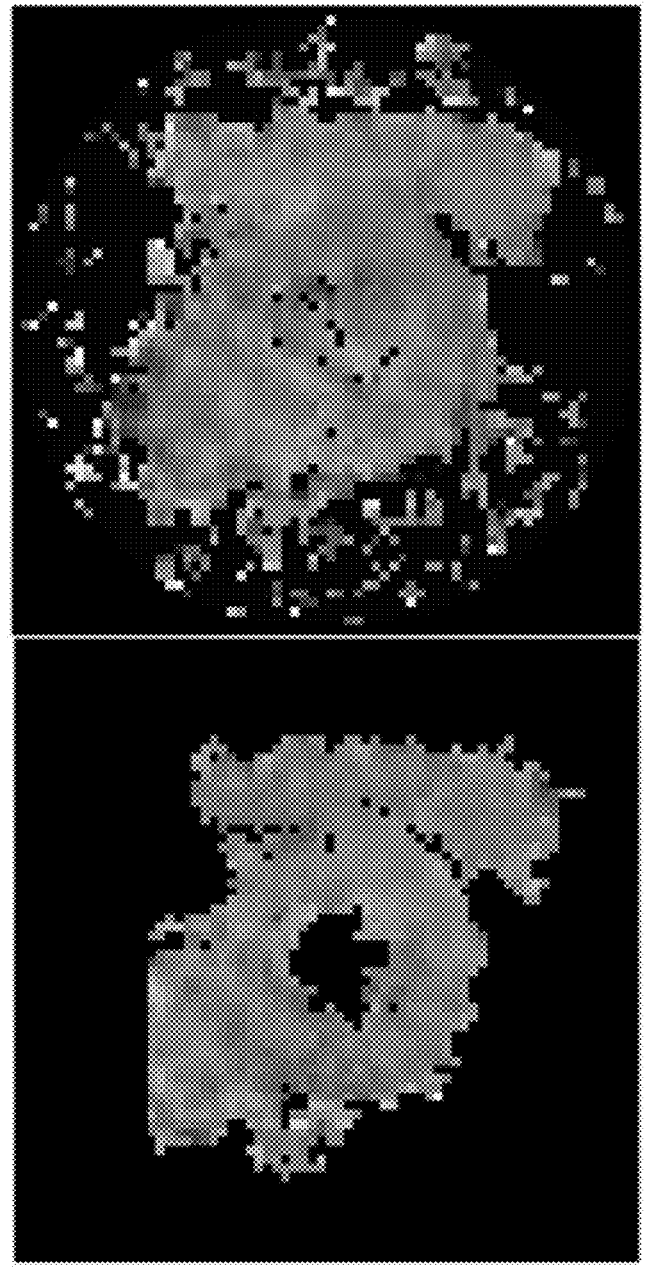
FIG. 9 shows outputted images of the phase unwrapping results of an embodiment of the instant method and of a compared prior method.

FIG. 9 shows outputted images of the phase unwrapping results of an embodiment of the instant method and of a compared prior method ([5]). In FIG. 9, it is clearly illustrated that the embodiment of the instant method excludes more extramyocardial pixels than the prior automatic method.

Figure 10:
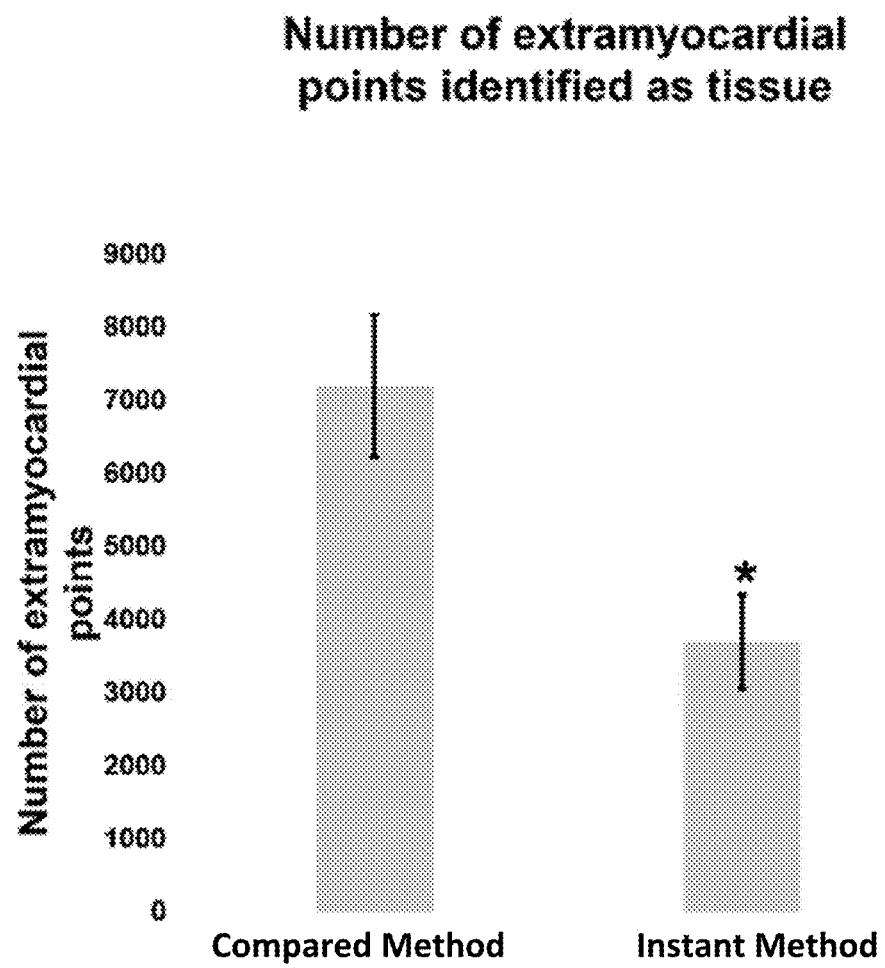
FIG. 10 shows a bar graph of the numbers of extramyocardial points incorrectly identified as tissue by an embodiment of the instant method and a compared prior method.

FIG. 10 shows a bar graph of the numbers of extramyocardial points incorrectly identified as tissue by an embodiment of the instant method and a compared prior method ([5]). For all volunteers in the study, the embodiment of the instant method significantly reduced the number of pixels used for displacement and strain calculation thus reducing the overall computation time. A confidence line of P<0.01 is denoted in FIG. 10 by *.

Figure 11:
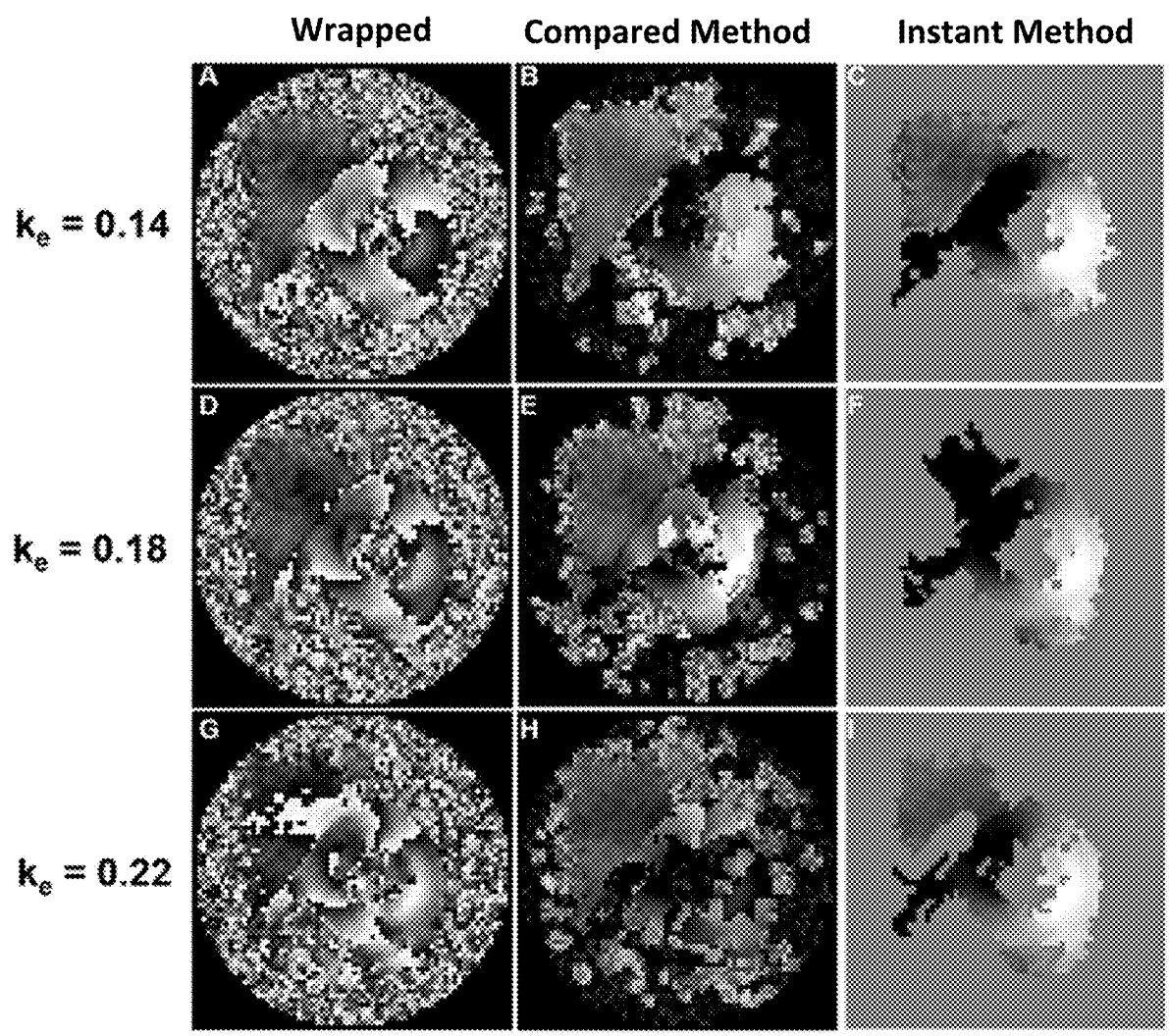
FIG. 11 shows examples of phase unwrapping results from DENSE datasets having multiple cycles of wrapping.

FIG. 11 shows examples of phase unwrapping results from DENSE datasets having multiple cycles of wrapping. Specifically, FIG. 11 shows phase unwrapping results for DENSE datasets with increasing values of $k_e$ that resulted in multiple cycles of wrapping. As shown in FIG. 11, an embodiment of the instant method successfully unwrapped the myocardium for all $k_e$ values whereas the prior phase unwrapping algorithm failed. Also, the embodiment of the instant method removed more of the surrounding tissue compared to the previous method.

Figure 12:
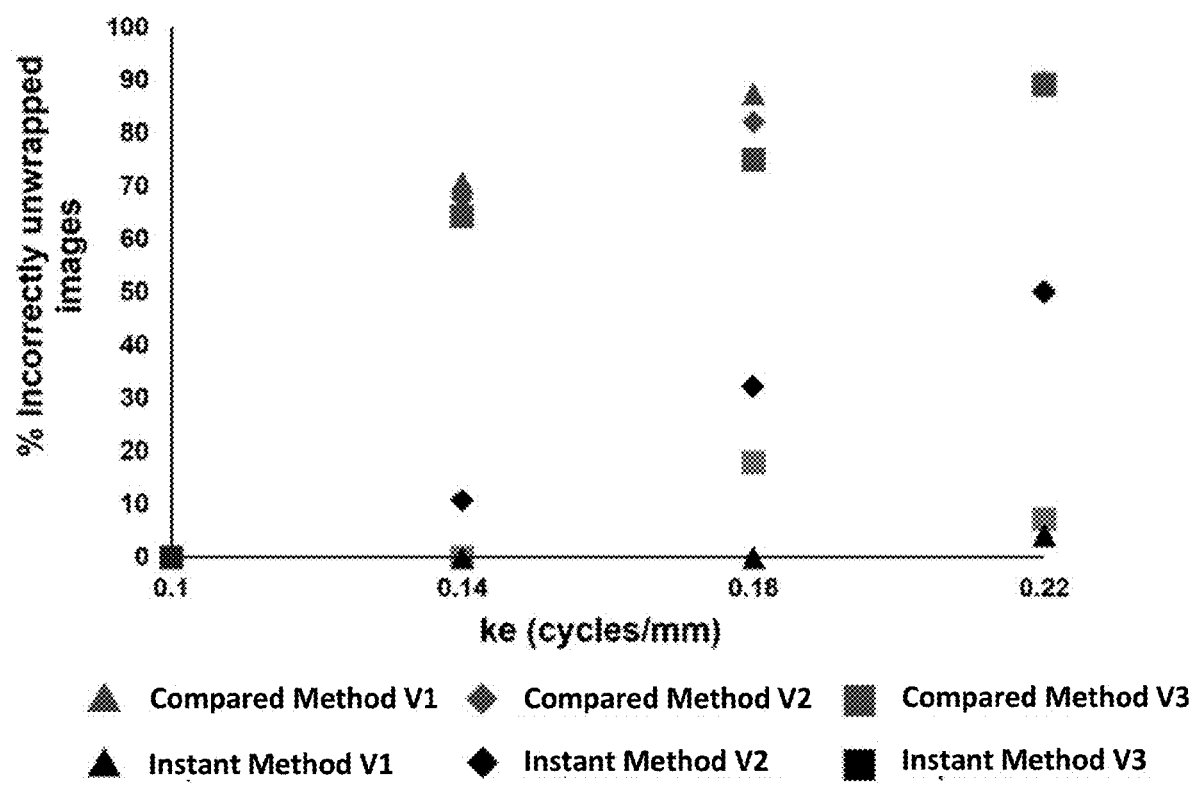
FIG. 12 illustrates that an embodiment of the instant method can successfully unwrap datasets with multiple cycles of phase wrapping, in contrast to a compared prior method.

FIG. 12 illustrates that an embodiment of the instant method can successfully unwrap datasets with multiple cycles of phase wrapping, in contrast to a compared prior method ([5]). Specifically, FIG. 12 shows the percent of phase unwrapping errors for the embodiment of the instant method and the compared prior method at varying $k_e$ values for 3 data sets (corresponding to 3 volunteers). The embodiment of the instant method shows a reduced number of incorrectly unwrapped images for all $k_e$ values. In FIG. 12, $V_i$ refers to the volunteer "i".

FIGS. 13A, 13B, and 13C show end-systolic principle shortening strain (PSS) map automatically computed using an embodiment of the instant method and using manually-drawn LV contours. Specifically, FIG. 13A show an end-systolic PSS map automatically computed using an embodiment of the instant method. FIG. 13B shows an end-systolic PSS map calculated using manually-drawn contours. FIG. 13C shows an end-systolic PSS map calculated automatically (from FIG. 13A) and subsequently masked with manually-drawn contours (from FIG. 13B).

Figure 14:
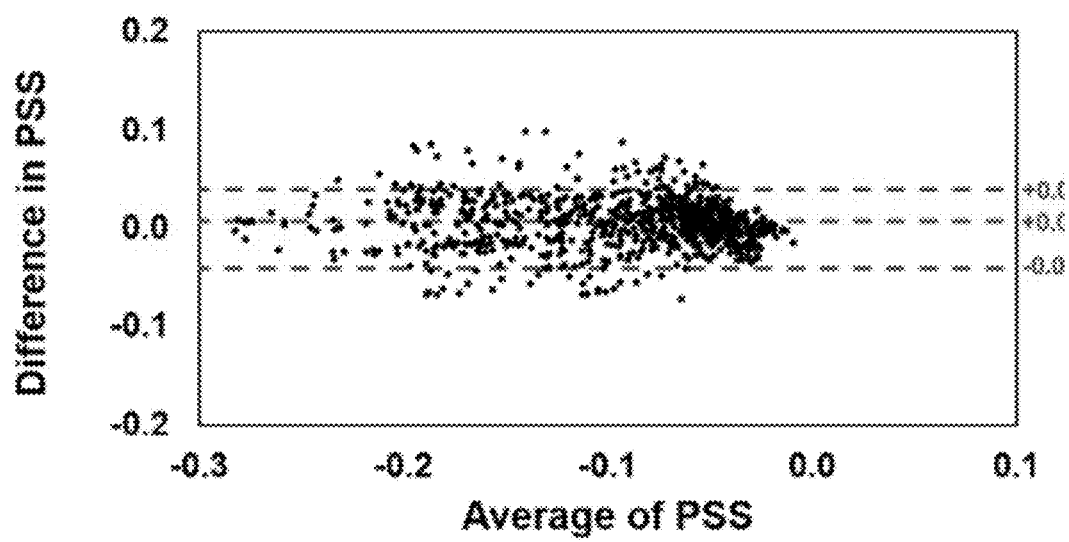
FIG. 14 shows Bland-Altman plots of segmental PSS of masked regions of FIG. 13C.
Figure 15:
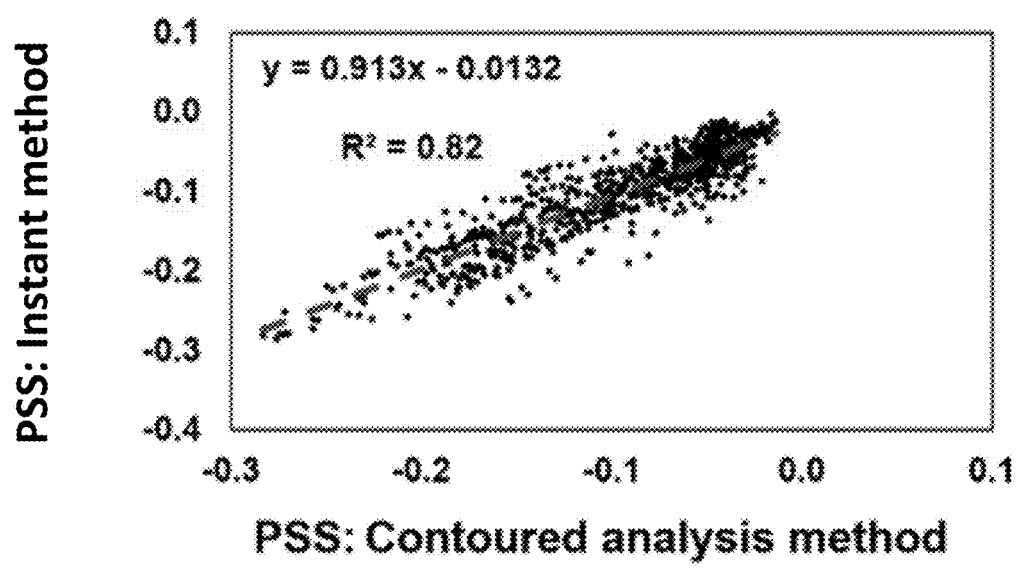
FIG. 15 shows a correlation plot of segmental PSS between an embodiment of the instant method and the manually-drawn LV contours.

FIG. 14 shows Bland-Altman plots of segmental PSS of masked regions of FIG. 13C. The plot is generated using analysis from all volunteers in the study. FIG. 15 shows a correlation plot of segmental PSS between the embodiment of the instant method and the manually-drawn LV contours. Notably, there is agreement and correlation shown among principle shortening strain (PSS) values calculated using the manually-drawn LV contours and an embodiment of the instant method. And, according to FIGS. 14 and 15, the Bland-Altman and correlation plots comparing the two methods indicate a small bias (+0.007) and excellent correlation ($R2=0.82$).

DISCUSSION

Displacement encoding with stimulated echoes (DENSE) measures myocardial displacements using the signal phase. Phase wrapping generally occurs during systolic phases, thus spatiotemporal phase unwrapping algorithms are required to compute motion trajectories and strain. Current DENSE analysis methods are aided by user-defined myocardial contours. A instant automated DENSE analysis fully automates DENSE analysis where phase predictions using multiple pathways and region growing are used to simultaneously unwrap and segment the myocardium. Compared to a prior automatic method, embodiments of the instant method select fewer extramyocardial pixels, reducing the computation time, and has a greater phase unwrapping success rate.

Cine DENSE measures myocardial displacements by encoding tissue displacement into the signal phase. Displacement encoding frequencies ($k_e$) are selected to balance signal-to-noise ratio, displacement sensitivity, and artifact suppression [4], resulting in phase wrapping during systole. Spatiotemporal phase unwrapping is required to compute Lagrangian motion trajectories and strain [4] [5]. Phase unwrapping may be aided by delineating the myocardium using manually-defined contours [2]. Indeed, the embodiment of the instant method provides a fully automatic phase unwrapping method that would eliminate the need for user intervention and that can identify fewer extramyocardial pixels (as compared to other methods) as input into the displacement trajectory and strain calculations—thus, reducing computational burden as compared to previous methods. A further limitation of the previous algorithm was an inability to unwrap DENSE datasets with multiple cycles of wrap. Indeed, embodiments of the instant phase unwrapping method may identify fewer extramyocardial pixels and successfully unwrap datasets with multiple cycles of phase wrap.

CONCLUSION

Fully automatic phase unwrapping using multiple phase prediction pathways and region growing may provide improved delineation of myocardial tissue and more reliable phase unwrapping than prior automatic methods. Embodiments of the instant method may facilitate fully automatic in-line strain mapping for DENSE.

The specific configurations, choice of materials and the size and shape of various elements can be varied according to particular design specifications or constraints requiring a system or method constructed according to the principles of the disclosed technology. Such changes are intended to be embraced within the scope of the disclosed technology. The presently disclosed embodiments, therefore, are considered in all respects to be illustrative and not restrictive. The patentable scope of certain embodiments of the disclosed technology is indicated by the appended claims, rather than the foregoing description.

LIST OF REFERENCES

[1] Simpson, R. M. et al., JMRI 2013; 37(3): 576-599.
[2] Spottiswoode, B. S. et al., Med. Image Anal. 2009, 13: 105-15
[3] Young, A. A. et al., Magnetic Resonance in Medicine 2012, 67(6): 1590-1599.
[4] Spottiswoode, B. S. et al, IEEE Trans. Med. Imaging 2007; 26:15-20.
[5] Gilliam, A. D. et al., IEEE Trans. Med. Imaging 2012, 31: 1669-81.
[6] Xu, W. et al., IEEE Trans. on Geoscience and Remote Sensing 1999, 37:124-34.

What is claimed is:

1. A method comprising:
acquiring magnetic resonance data associated with a physiological activity in an area of interest of a subject, wherein the acquired magnetic resonance data includes one or more phase-encoded data sets associated with a displacement encoding with stimulated echo (DENSE) measurement; and
determining, from at least the one or more phase-encoded data sets, a data set corresponding to the physiological activity in the area of interest, wherein the determination comprises performing phase unwrapping of the phase-encoded data set using phase predictions and region growing by:
identifying, by a processor executing an algorithm, an initial region where phase wrapping has not occurred;
iteratively determining, by the processor, a perimeter of phase-wrapped pixels; and
adding, by the processor, one or more pixels of candidate growth pixels evaluated via spatiotemporal linear prediction analysis determined at least from the one or more pixels, wherein a portion of the one or more pixels is added based on a reliability threshold established from the spatiotemporal linear prediction analysis.

2. The method of claim 1, wherein each spatiotemporal linear prediction analysis comprises at least an assessment of predicted phase and an assessment of variation in predictions, among i) a pixel of the one or more pixels and ii) one or more neighboring pixels along an assessed pathway.

3. The method of claim 2, wherein multiple spatiotemporal prediction pathways are used for each perimeter pixel undergoing evaluation, and wherein the assessment of variation is among the predictions from the different pathway.

4. The method of claim 1, wherein the added pixels include regions with reliable predictions and excludes regions with unreliable predictions.

5. The method of claim 4, wherein the regions with reliable predictions are associated with identification of myocardial tissue.

6. The method of claim 4, wherein the regions with unreliable predictions are associated with noise.

7. The method of claim 1, wherein the phase-encoded data set comprises data from a displacement encoding with stimulated echo (DENSE) measurement.

8. The method of claim 1, wherein the phase-encoded data set comprises two-dimensional data, the evaluated one or more pixels of candidate phase-wrapped pixels being evaluated in two or more encoding directions.

9. The method of claim 8, wherein the two or more encoding directions include a first direction and a second direction, wherein the first direction is orthogonal to the second direction.

10. The method of claim 8, wherein the two or more encoding directions are applied simultaneously at each given region growth iteration.

11. The method of claim 1, wherein the determined data set includes displacement-encoded information.

12. The method of claim 1, wherein the determined data set includes one or more reconstructed images of the physiological activity in the area of interest.

13. The method of claim 1, wherein the method is used to fully automate in-line strain mapping for DENSE measurements.

14. The method of claim 1, wherein the step of identifying the initial region comprises applying a principal component analysis to one or more DENSE images.

15. The method of claim 1, wherein the one or more pixels of candidate growth pixels are located adjacent to the perimeter of phase-wrapped pixels.

16. The method of claim 1, wherein the magnetic resonance data associated with the physiological activity in the area of interest includes MRI acquisition of the myocardium.

17. The method of claim 1, wherein the magnetic resonance data associated with the physiological activity in the area of interest is acquired from a region selected from the group consisting of the heart, skeletal muscle, brain, head, neck, mouth, spine, chest, lung, arm, hand, knee, and foot.

18. A system comprising:
at least one processor;
at least one memory device coupled to the processor and storing computer-readable instructions which, when executed by the at least one processor, cause the system to perform functions that comprise:
acquiring magnetic resonance data associated with a physiological activity in an area of interest of a subject, wherein the acquired magnetic resonance data includes one or more phase-encoded data sets associated with a displacement encoding with stimulated echo (DENSE) measurement; and
determining, from at least the one or more phase-encoded data sets, a data set corresponding to the physiological activity in the area of interest, wherein the reconstruction comprises performing phase unwrapping of the phase-encoded data set using phase predictions and region growing by:
identifying an initial region where phase wrapping has not occurred;
iteratively determining a perimeter of phase-wrapped pixels; and
adding one or more pixels of candidate growth pixels evaluated via spatiotemporal linear prediction analysis determined at least from the one or more pixels, wherein a portion of the one or more pixels is added based on a reliability threshold established from the spatiotemporal linear prediction analysis.

19. A non-transitory computer-readable medium having stored instructions that, when executed by one or more processors, cause a computing device to perform functions that comprise:
acquiring magnetic resonance data associated with a physiological activity in an area of interest of a subject, wherein the acquired magnetic resonance data includes one or more phase-encoded data sets associated with a displacement encoding with stimulated echo (DENSE) measurement; and
determining, from at least the one or more phase-encoded data sets, a data set corresponding to the physiological activity in the area of interest, wherein the reconstruction comprises performing phase unwrapping of the phase-encoded data set using phase predictions and region growing by:
identifying an initial region where phase wrapping has not occurred;
iteratively determining a perimeter of phase-wrapped pixels; and
adding one or more pixels of candidate growth pixels evaluated via spatiotemporal linear prediction analysis determined at least from the one or more pixels, wherein a portion of the one or more pixels is added based on a reliability threshold established from the spatiotemporal linear prediction analysis.

* * * * *